(12) United States Patent
Wang

(10) Patent No.: US 11,220,224 B2
(45) Date of Patent: Jan. 11, 2022

(54) VEHICULAR CAMERA ASSEMBLY WITH ENHANCED LENS-IMAGER JOINT

(71) Applicant: Magna Electronics Inc., Auburn Hills, MI (US)

(72) Inventor: Jianguo Wang, Troy, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

(21) Appl. No.: 16/439,793

(22) Filed: Jun. 13, 2019

(65) Prior Publication Data

US 2019/0381952 A1 Dec. 19, 2019

Related U.S. Application Data

(60) Provisional application No. 62/814,936, filed on Mar. 7, 2019, provisional application No. 62/684,256, filed on Jun. 13, 2018.

(51) Int. Cl.
*B60R 11/04* (2006.01)
*G02B 7/02* (2021.01)
*H05K 1/02* (2006.01)
*H04N 5/225* (2006.01)

(52) U.S. Cl.
CPC .............. *B60R 11/04* (2013.01); *G02B 7/02* (2013.01); *H04N 5/2252* (2013.01); *H04N 5/2254* (2013.01); *H05K 1/0274* (2013.01)

(58) Field of Classification Search
CPC .. H04N 5/2254; H04N 5/2257; H04N 5/2253; H04N 5/2252; H01L 2224/48091; H01L 27/14618; H01L 27/14625; G02B 7/08; G02B 7/02; B60R 1/12; B60R 11/04; G03B 3/10
See application file for complete search history.

(56) References Cited

U.S. PATENT DOCUMENTS

| | | |
|---|---|---|
| 5,550,677 A | 8/1996 | Schofield et al. |
| 5,670,935 A | 9/1997 | Schofield et al. |
| 5,949,331 A | 9/1999 | Schofield et al. |
| 7,965,336 B2 | 6/2011 | Bingle et al. |
| 8,542,451 B2 | 9/2013 | Lu et al. |
| 9,233,641 B2 | 1/2016 | Sesti et al. |
| 9,277,104 B2 | 3/2016 | Sesti et al. |
| 2013/0242099 A1 | 9/2013 | Sauer et al. |
| 2014/0373345 A1 | 12/2014 | Steigerwald |
| 2015/0222795 A1 | 8/2015 | Sauer et al. |
| 2015/0266430 A1 | 9/2015 | Mleczko et al. |

(Continued)

*Primary Examiner* — Farhan Mahmud
(74) *Attorney, Agent, or Firm* — Honigman LLP

(57) ABSTRACT

A vehicular camera for a vision system of a vehicle includes a camera housing, a printed circuit board (PCB), and a lens barrel supporting a lens. The lens barrel includes a first end and a second end, the second end having a lens barrel flange. The lens barrel flange may be coupled to the camera housing via adhesive, and the PCB may be coupled to the camera housing via adhesive. The lens barrel flange and the PCB are coupled to the camera housing at a common side of the camera housing. With the lens barrel flange coupled to the first portion of the camera housing, and with the PCB coupled to the second portion of the camera housing, the imager is optically aligned with the lens supported at the lens barrel. Optionally, the camera may include a lens holder having a metal portion and a plastic portion.

26 Claims, 5 Drawing Sheets

(56) References Cited

U.S. PATENT DOCUMENTS

| | | |
|---|---|---|
| 2015/0365569 A1 | 12/2015 | Mai et al. |
| 2016/0037028 A1 | 2/2016 | Biemer |
| 2016/0191863 A1* | 6/2016 | Minikey, Jr. ......... H04N 5/2257 348/148 |
| 2016/0268716 A1 | 9/2016 | Conger et al. |
| 2017/0133811 A1 | 5/2017 | Conger et al. |
| 2017/0295306 A1 | 10/2017 | Mleczko |
| 2017/0302829 A1 | 10/2017 | Mleczko et al. |
| 2018/0072239 A1 | 3/2018 | Wienecke et al. |
| 2019/0124238 A1 | 4/2019 | Byrne et al. |
| 2019/0124243 A1 | 4/2019 | Mleczko et al. |
| 2019/0306966 A1 | 10/2019 | Byrne et al. |
| 2020/0001787 A1 | 1/2020 | Lu et al. |
| 2020/0010024 A1 | 1/2020 | Sesti et al. |
| 2020/0033549 A1 | 1/2020 | Liu et al. |
| 2020/0154020 A1 | 5/2020 | Byrne et al. |

* cited by examiner

VEHICULAR CAMERA ASSEMBLY WITH ENHANCED LENS-IMAGER JOINT

CROSS REFERENCE TO RELATED APPLICATIONS

The present application claims the filing benefits of U.S. provisional application Ser. No. 62/814,936, filed Mar. 7, 2019, and U.S. provisional application Ser. No. 62/684,256, filed Jun. 13, 2018, which are hereby incorporated herein by reference in their entireties.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 8,542,451; 7,965,336; 5,949,331; 5,670,935 and/or 5,550,677, which are hereby incorporated herein by reference in their entireties.

SUMMARY OF THE INVENTION

The present invention provides a driver assistance system or vision system or imaging system for a vehicle that utilizes one or more cameras (preferably one or more CMOS cameras) disposed at a vehicle and having a field of view exterior of the vehicle. A control comprises an image processor that is operable to process image data captured by the camera. The control, responsive to image processing of image data captured by the camera, is operable to provide driver assistance or driving assistance, such as for assisting a driver in driving the vehicle or for providing autonomous or semi-autonomous control of the vehicle.

According to an aspect of the present invention, the vehicular camera includes a camera housing, a printed circuit board (PCB) having an imager disposed thereat, a lens barrel (accommodating at least one lens) comprising a first end and a second end, the second end comprising a lens barrel flange. The lens barrel flange is adhesively coupled to a portion of the camera housing via attachment using a cured adhesive. The PCB is also adhesively coupled to the portion of the camera housing via attachment using a cured adhesive. The lens barrel flange and the PCB attach at a common side of a wall of the camera housing. With the lens barrel flange adhesively bonded or coupled to the first portion of the camera housing, and with the PCB adhesively bonded or coupled to the second portion of the camera housing, the imager is optically aligned with the lens supported at or accommodated at the lens barrel.

According to another aspect of the present invention, the vehicular camera comprises a printed circuit board (PCB) having an imager disposed thereat, a camera housing having a lens holder comprising a metal portion and a plastic portion, and a lens barrel supporting or accommodating at least one lens. The lens barrel comprises a lens barrel flange. The plastic portion of the lens holder is coupled (such as via adhesive bonding) to the lens barrel flange via adhesive, and the PCB is coupled (such as via adhesive bonding or via one or more fasteners or the like) to the metal portion of the lens holder. With the plastic portion of the lens holder coupled to the lens barrel flange and the PCB coupled to the metal portion of the lens holder, the imager is optically aligned with the lens supported at the lens barrel.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and to provide an output to a display device for displaying images representative of the captured image data. Optionally, the vision system may provide display, such as a rearview display or a top down or bird's eye or surround view display or the like.

Figure 1:
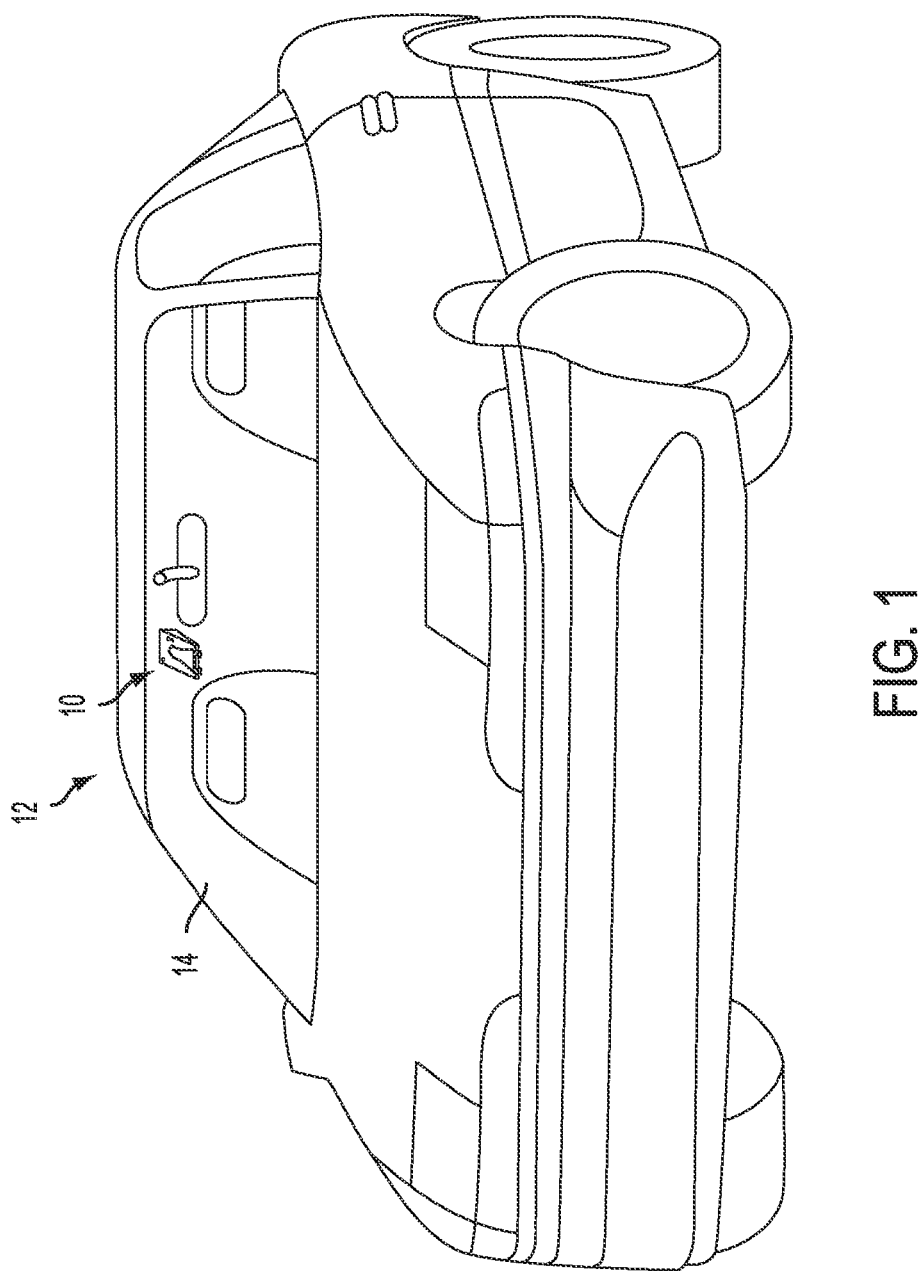
FIG. 1 is a perspective view of a vehicle with a vision system that incorporates cameras in accordance with the present invention.

Referring now to the drawings and the illustrative embodiments depicted therein, vision system 10 for a vehicle 12 includes at least one exterior viewing imaging sensor or camera, such as a forward viewing imaging sensor or camera, which may be disposed at an in-cabin side of the windshield 14 and behind the windshield of the vehicle and viewing forward through the windshield so as to capture image data representative of the scene occurring forward of the vehicle (FIG. 1). Optionally, the system may include multiple exterior viewing imaging sensors or cameras, such as a forward viewing camera at the front of the vehicle, and a sideward/rearward viewing camera at respective sides of the vehicle, and a rearward viewing camera at the rear of the vehicle, which capture images exterior of the vehicle. The camera or cameras each include a lens for focusing images at or onto an imaging array or imaging plane or imager of the camera. Optionally, the forward viewing camera may be disposed at the windshield of the vehicle and view through the windshield and forward of the vehicle, such as for a driving assist system (such as for traffic sign recognition, headlamp control, pedestrian detection, collision avoidance, lane marker detection and/or the like). Optionally, a camera may be disposed inside the vehicle with a field of view interior of the vehicle, such as for a driver monitoring system or passenger or baby monitoring system or the like. The vision system 10 includes a control or electronic control unit (ECU) or processor that is operable to process image data captured by the camera or cameras and may detect objects or the like and/or provide displayed images at a display device for viewing by the driver of the vehicle. The data transfer or signal communication from the camera to the ECU may comprise any suitable data or communication link, such as a vehicle network bus or the like of the equipped vehicle.

Positioning and securing the lens relative to the imager is critical in camera design. This holds especially true in automotive video camera design because of the stringent environment requirements in the automobile industry. For example, the safety requirements in the automobile require high image quality stability. Poor lens joint design can lead to large camera focus variation throughout the camera's lifetime.

Figure 2:
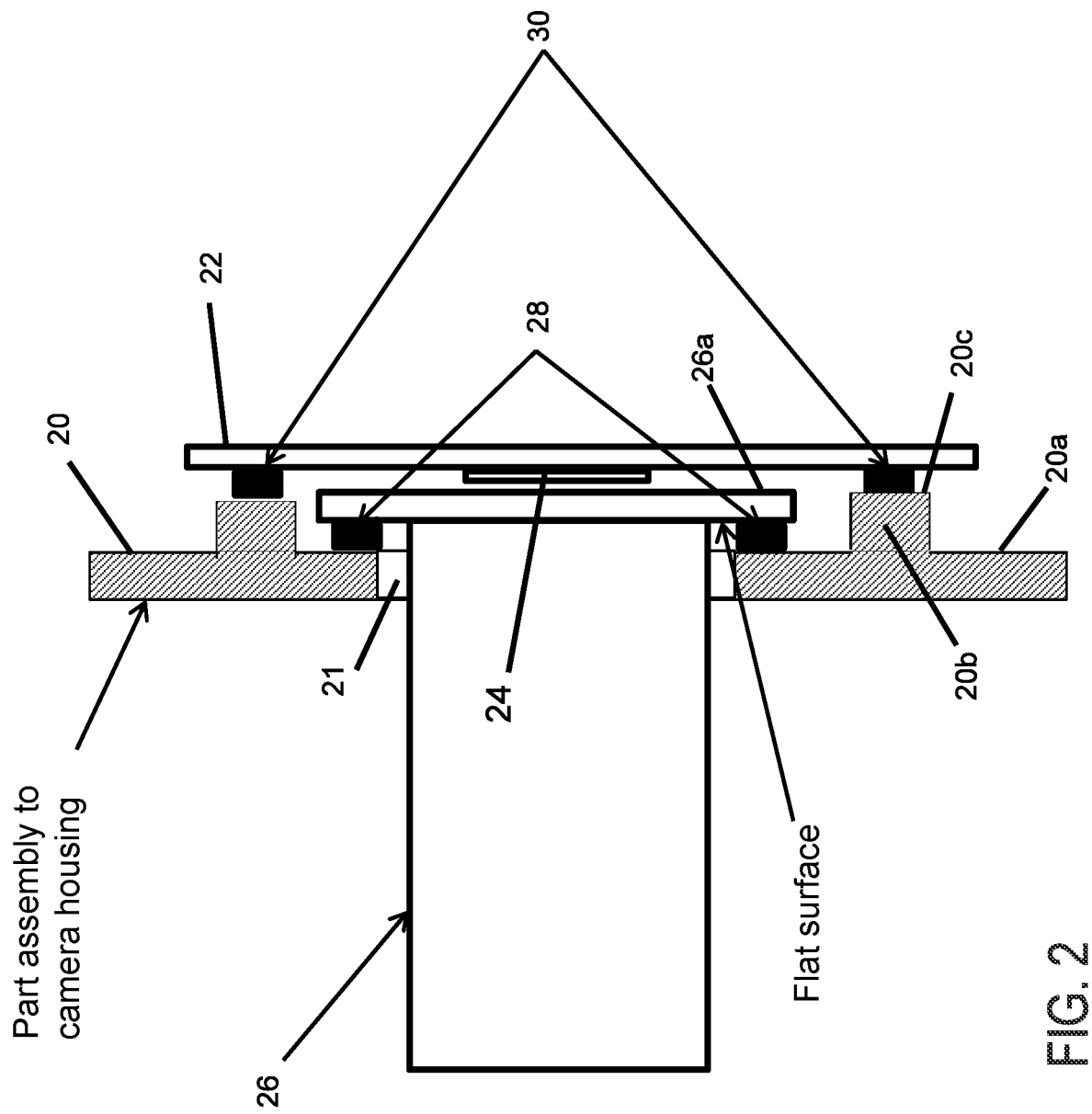
FIG. 2 is a cross-section of a lens-imager assembly in accordance with the present invention.

Referring now to FIG. 2, the camera includes a portion 20 of a camera housing that includes a lens barrel aperture 21 established through a wall thickness of the housing portion 20. The camera housing portion comprises a front wall of the camera, such as at a lens holder portion or front camera housing portion of the camera housing (which may also have a rear camera housing portion that mates with the front camera housing portion to house or encase camera circuitry therein). The camera also includes an image sensor printed circuit board (PCB) 22 (with an imager 24 disposed thereat) and a lens barrel 26.

The lens barrel 26 includes a first end and a second end, with a lens barrel flange 26a disposed or formed at or near the second end. The lens barrel flange 26a comprises a circular flange circumscribing the lens barrel at the second end of the lens barrel and providing an annular flat surface for attachment at the camera housing 20. The first end of the lens barrel protrudes through the lens barrel aperture beyond an outer side of the wall of housing portion 20 and the lens barrel flange 26a is bonded or coupled to an inner side or surface 20a of the wall of the housing portion 20 of the camera housing via adhesive 28. The adhesive may comprise a circular ring of adhesive dispensed in its uncured state so as to be disposed around and circumscribing the aperture 21 to (in its cured or at least partially cured state) attach or adhesively bond the lens barrel flange 26a at the inner surface 20a of the camera housing portion 20.

The PCB 22 is also coupled to the camera housing portion 20 via adhesive 30. As shown in FIG. 2, the housing portion 20 includes a cylindrical protrusion 20b that protrudes inboard (and toward and/or into the cavity of the camera) from the inner side or surface of the wall of the housing portion 20 and that provides an annular attaching surface 20c that is spaced from the inner side or surface of the wall of the housing portion 20. The adhesive 30 may comprise a circular ring of adhesive dispensed in its uncured state so as to be disposed around the annular attaching surface 20c to (in its cured or at least partially cured state) attach or adhesively bond the PCB 22 at the annular attaching surface 20c of the cylindrical protrusion 20b of the camera housing portion 20. The image plane (at the imager 24) is then parallel with the PCB 22 and the lens barrel flange 26a, and a space or gap is present between the lens barrel flange 26a and the imager 24.

The lens barrel 26 and the PCB 22 are not in direct contact but are coupled via the housing portion and the adhesive. Specifically, the lens barrel and the PCB may only be in indirect contact via the adhesive 28, 30 and camera housing portion 20. This allows the camera to maintain focus consistently despite ambient temperature variations because the camera can compensate for lens and image sensor PCB movement.

In other words, gluing or bonding the lens barrel flange and the imager PCB in this way (at the same or common side of the wall of the camera housing portion) allows for compensation for the movement caused by shrinkage and expansion of the cured adhesive during temperature variation. This is because any shrinkage or expansion of the cured adhesive will adjust the lens and the PCB and imager the same relative to the camera housing, thereby compensating for or accommodating any such fluctuation in adhesive bond-line thickness during exposure of the camera to such temperature variations. Thus, with the lens barrel flange coupled to a first portion of the camera housing, and with the PCB coupled to a second portion of the camera housing that is at the same side or common side of the wall of the camera housing portion, the imager is optically aligned with the lens supported at the lens barrel.

Figure 3:
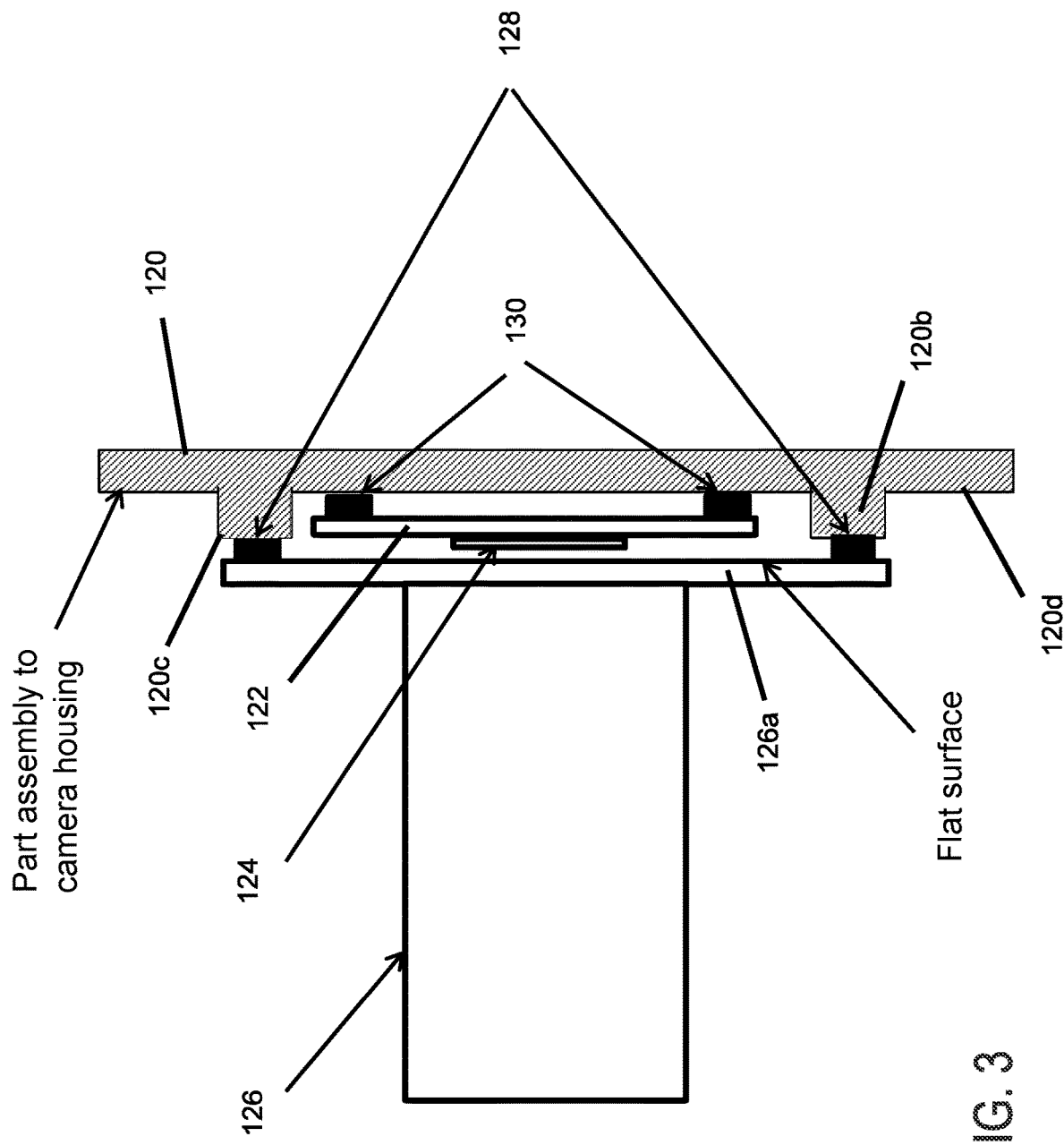
FIG. 3 is a cross-section of another lens-imager assembly in accordance with the present invention.

The camera structure may be of a different shape and position while maintaining the same concept. For example, as shown in FIG. 3, the lens barrel 126 may not protrude through a lens barrel aperture of the camera housing portion, and instead an annular flat surface of the lens barrel flange 126a may be coupled to a cylindrical protrusion 120b that protrudes outboard from an outer surface 120d of the camera housing portion 120 via adhesive 128. The PCB 122 (having the imager 124 thereat) may be coupled to the outer or outboard surface 120d of the camera housing portion 120 via adhesive 130, with a desired or set gap existing between the PCB and the lens barrel. The gap may occur through "risers" or other methods of adhering the lens barrel to a raised portion of the camera housing (or adhering the PCB to a lowered portion of the camera housing) so that a gap or space exists between the lens barrel flange and PCB.

In the illustrated embodiments, the gap is established at least in part by the length of the cylindrical protrusion that provides the annular attachment surface at which the lens barrel flange 126a or PCB 22 is adhesively attached via adhesive 128 or 30. Thus, the imager PCB and the lens barrel are adhesively attached at the same side of the camera housing portion, with the imager optically aligned with the lens supported at the lens barrel, such that shrinkage or expansion of the adhesive will adjust the lens and the PCB and imager the same relative to the camera housing, thereby compensating for or accommodating any such fluctuation in adhesive bond-line thickness during such temperature variations.

The adhesive may comprise any suitable adhesive, such as a UV-cured adhesive that, when cured, secures the lens barrel and PCB at the camera housing portion in a manner suitable for use of the camera in a vehicle. The adhesive may comprise an adhesive that is cured to a first cure level via exposure of the adhesive via a UV or light curing process and that is cured to a second greater cure level via a thermal or humidity curing process. For example, the adhesive may be of the types described in U.S. Pat. Nos. 9,277,104 and/or 8,542,451, which are hereby incorporated herein by reference in their entireties. For example, the adhesive may comprise a DELO DUALBOND® dual cured adhesive commercially available from Delo of Windach, Bavaria, Germany. For example, the adhesive may comprise a UV-heat curing or UV/light/heat curing adhesive comprising a one-part, solvent free, filled thixotropic and modified epoxy resin base, such as DELO DUALBOND® OB786 or DELO DUALBOND® OB787 or the like. The adhesive that joins the lens barrel at the camera housing portion may comprise the same adhesive that joins the PCB at the camera housing portion, or the two adhesives may comprise different adhesives for the respective coupling joints. For example, because the materials of the joined or bonded or attached parts have different thermal properties, different adhesives with different thermal properties may be selected to compensate for or to accommodate the different degrees of thermal expansion and contraction of the joined components.

Figure 4:
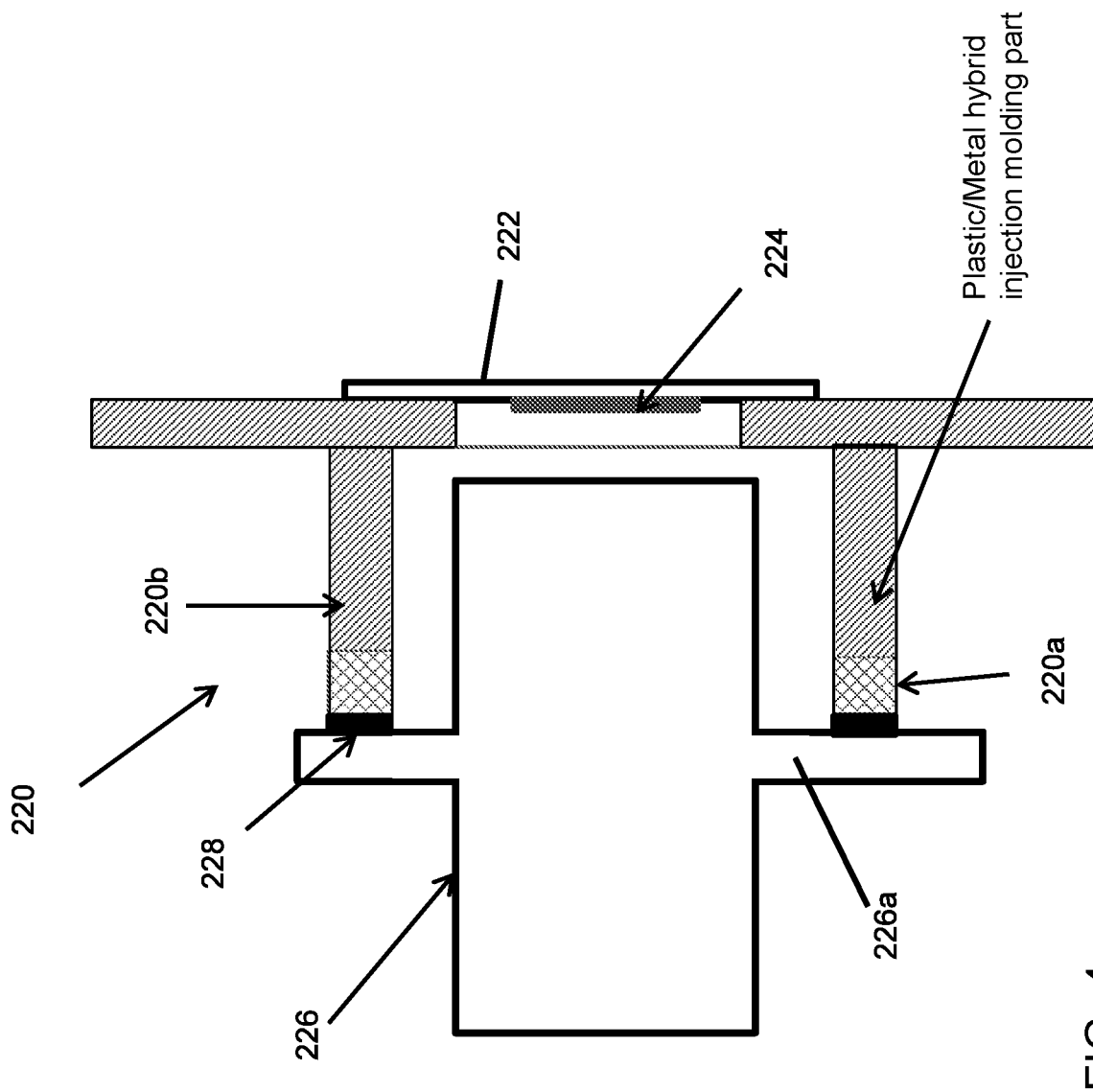
FIG. 4 is a cross-section of another lens-imager assembly in accordance with the present invention.

Referring now to FIG. 4, in another implementation, a vehicular camera for a vehicular vision system includes a PCB 222 and a lens barrel 226 that supports a lens and includes a lens flange 226a. The camera also includes a lens holder 220 (that may be part of the camera housing). The lens holder 220 may include a hybrid metal-plastic material. That is, the lens holder may include a plastic portion 220a and a metal portion 220b. For example, part of the lens holder may include an aluminum portion 220b (such as the part that attaches at the imager circuit board and the part that extends at least partially along the lens barrel received therein) while a separate portion may include a plastic material 220a (such as the part of the lens holder that is adhered or bonded or welded at the flange of the lens holder).

Figure 5:
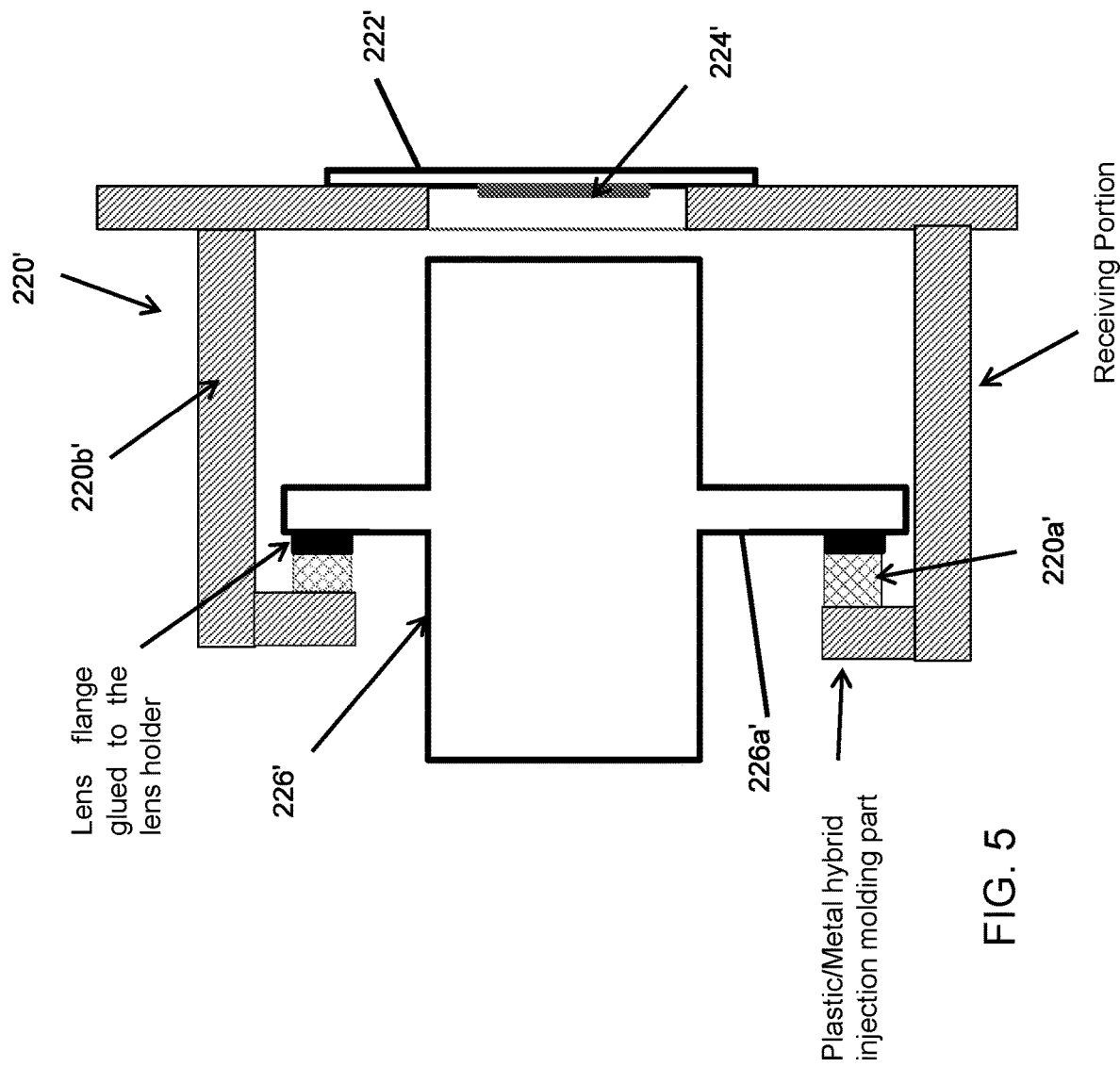
FIG. 5 is a cross-section of another lens-imager assembly in accordance with the present invention.

The plastic portion of the lens holder is coupled to the lens barrel flange 226a via any suitable means, such as via adhesive 228 or glue or the like. The plastic portion may be coupled to an inboard side of the lens barrel flange 226a (FIG. 4). Optionally, and with reference to FIG. 5, the plastic portion 220a' of the lens holder 220' may be coupled to an outboard side of the lens barrel flange 226a' (with the plastic portion 220a' joined to the metal portion or aluminum portion 220b' of the lens holder 220'). Thus, with the plastic portion of the lens holder coupled to the lens barrel flange and the PCB coupled to the metal portion of the lens holder, the imager is optically aligned with the lens supported at the lens barrel.

The imager PCB 222, 222' is coupled to the metal portion 220b, 220b' of the lens holder 220, 220' (such as via adhesive or fasteners or the like). The lens holder may comprise a cylindrical arm or receiving portion that circumscribes the lens barrel received therein. The plastic material element may comprise an annular ring-shaped element established at an end or surface of the metallic cylindrical receiving portion for attachment at the annular surface of the flange of the lens barrel. The imager PCB 222, 222' (having the imager 224, 224' disposed thereat) may be assembled to the lens holder to produce a lens-imager assembly that may compensate the imager assembly thermal focus shift by optimizing the ratio of the length of the plastic portion to the length of the metal portion. That is, a ratio of a length of the plastic portion to the metal portion of each arm may optimize a thermal focus shift of the vision system. The hybrid material lens holder may be produced, for example, by injection molding.

Thus, the hybrid material lens holder comprises both a metallic material or element and a polymeric material or element. The materials (and sizes) of the elements are selected to provide the desired enhanced compensation for thermal focus shift. Exemplary metals suitable for the metal part of the hybrid material lens holder include steel, magnesium, aluminum, zinc and alloys thereof (e.g., Aluminum 1100 aluminum alloy). Exemplary plastic/polymeric materials suitable for the plastic part of the hybrid material lens holder include fiberglass-reinforced materials, such as fiberglass-reinforced polyamide 6 or Nylon (GR-PA 6) engineering polymer, such as OmniLon™ PA6 GB30 Nylon 6, 30% glass reinforced polymer available from Omni Plastics of Evansville, Ind. For example, the hybrid material lens holder may comprise an aluminum part and a fiberglass-reinforced polymeric part or the hybrid material lens holder may comprise a steel part and a fiberglass-reinforced polymeric part.

Therefore, the vehicular camera provides enhanced focus and optical alignment of the lens with the imager via attachment of the lens barrel to the housing or lens holder and attachment of the imager PCB to the housing or lens holder. The joint of attachment or securement of the lens to the imager is critical in camera design, particularly in automotive video camera applications. The safety requirements in the automotive industry require high image quality stability. Poor camera design can lead to large camera focus variations over the camera's lifetime. The vehicular camera of the present invention maintains camera focus consistent with ambient temperature variation by compensating for lens movement and imager movement. The vehicular camera uses adhesive or glue to bond the lens barrel flange and the imager PCB board in the way that can compensate the movement caused by glue shrinkage and expansion when the camera is exposed to temperature variation. The vehicular camera may also use plastic and metal parts for the lens holder to compensate for such movement. The camera structures may vary in shape and position.

The camera may utilize aspects of the cameras described in U.S. Pat. Nos. 9,277,104; 9,233,641; 8,542,451 and/or 7,965,336, and/or U.S. Publication Nos. US-2013-0242099; US-2014-0373345; US-2015-0222795; US-2015-0266430; US-2015-0365569; US-2016-0037028; US-2016-0268716; US-2017-0133811; US-2017-0295306 and/or US-2017-0302829, which are hereby incorporated herein by reference in their entireties. Optionally, electrical connections in the camera may be established via molded interconnect device (MID) technology, such as by utilizing aspects of the cameras described in U.S. Publication Nos. US-2018-0072239; US-2017-0295306 and/or US-2016-0037028, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The vision system or driving assist system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

For example, the vision system and/or processing and/or camera and/or circuitry may utilize aspects described in U.S.

Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/081985, and/or U.S. Pat. No. 9,126,525, which are hereby incorporated herein by reference in their entireties.

Optionally, the camera may comprise a forward viewing camera, such as disposed at a windshield electronics module (WEM) or the like. The forward viewing camera may utilize aspects of the systems described in U.S. Pat. Nos. 8,256,821; 7,480,149; 6,824,281 and/or 6,690,268, and/or U.S. Publication Nos. US-2015-0327398; US-2015-0015713; US-2014-0160284; US-2014-0226012 and/or US-2009-0295181, which are all hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular camera for a vision system of a vehicle, the vehicular camera configured to be disposed at a vehicle, the vehicular camera comprising:
    a camera housing comprising a wall having an inner surface at an inner side of the wall and an outer surface at an outer side of the wall;
    a printed circuit board (PCB) having an imager disposed thereat;
    a lens barrel accommodating a lens, the lens barrel comprising a first end and a second end, the lens barrel comprising a lens accommodating portion and a lens barrel flange that circumscribes the lens accommodating portion;
    wherein the lens barrel flange is adhesively attached at a first attachment surface of the camera housing via adhesive;
    wherein the PCB is adhesively attached at a second attachment surface of the camera housing via adhesive;
    wherein the first attachment surface of the camera housing and the second attachment surface of the camera housing are at a common side of the wall of the camera housing; and
    wherein, with the lens barrel flange adhesively attached at the first attachment surface of the camera housing, and with the PCB adhesively attached at the second attachment surface of the camera housing, the imager is optically aligned with the lens supported at the lens barrel.

2. The vehicular camera of claim 1, wherein the common side of the wall of the camera housing comprises the inner side of the wall of the camera housing, and wherein the wall of the camera housing comprises a lens barrel aperture, and wherein the first end of the lens barrel protrudes through the lens barrel aperture through the wall of the camera housing so as to be protrude beyond the outer surface at the outer side of the wall of the camera housing.

3. The vehicular camera of claim 2, wherein the second attachment surface of the camera housing comprises an annular surface at an inner end of a cylindrical protrusion that protrudes from the inner surface at the inner side of the wall of the camera housing.

4. The vehicular camera of claim 3, wherein the first attachment surface of the camera housing comprises a portion of the inner surface at the inner side of the wall of the camera housing that is radially inboard from the cylindrical protrusion.

5. The vehicular camera of claim 4, wherein the cylindrical protrusion circumscribes the portion of the inner surface at the inner side of the wall of the camera housing.

6. The vehicular camera of claim 4, wherein the PCB is spaced from the inner surface at the inner side of the wall and from the lens barrel via the cylindrical protrusion.

7. The vehicular camera of claim 1, wherein the common side of the wall of the camera housing comprises the outer side of the wall of the camera housing, and wherein the first attachment surface of the camera housing comprises an annular surface at an outer end of a cylindrical protrusion that protrudes from the outer surface at the outer side of the wall of the camera housing.

8. The vehicular camera of claim 7, wherein the second attachment surface of the camera housing comprises a portion of the outer surface at the outer side of the wall of the camera housing that is radially inward from the cylindrical protrusion.

9. The vehicular camera of claim 8, wherein the cylindrical protrusion circumscribes the portion of the outer surface at the outer side of the wall of the camera housing.

10. The vehicular camera of claim 8, wherein the lens barrel is spaced from the outer surface at the outer side of the wall and from the PCB via the cylindrical protrusion.

11. The vehicular camera of claim 1, wherein the lens barrel and the PCB are not in direct contact.

12. The vehicular camera of claim 11, wherein the lens barrel and the PCB are indirectly coupled via the adhesive and the camera housing.

13. The vehicular camera of claim 1, wherein the adhesive coupling the lens barrel flange to the first attachment surface of the camera housing comprises the same type of adhesive as the adhesive coupling the PCB to the second attachment surface of the camera housing.

14. A vehicular camera for a vision system of a vehicle, the vehicular camera configured to be disposed at a vehicle, the vehicular camera comprising:

a printed circuit board (PCB) having an imager disposed thereat;

a lens holder comprising a metal portion and a plastic portion;

a lens barrel accommodating a lens, the lens barrel comprising a lens accommodating portion and a lens barrel flange that circumscribes the lens accommodating portion;

wherein the plastic portion of the lens holder is adhesively attached at the lens barrel flange via adhesive;

wherein the PCB is attached at the metal portion of the lens holder; and wherein, with the plastic portion of the lens holder adhesively attached at the lens barrel flange and the PCB attached at the metal portion of the lens holder, the imager is optically aligned with the lens supported at the lens barrel.

15. The vehicular camera of claim 14, wherein the metal portion of the lens holder comprises aluminum.

16. The vehicular camera of claim 14, wherein the plastic portion of the lens holder is formed via injection molding.

17. The vehicular camera of claim 16, wherein the plastic portion is injection molded onto an end region of the metal portion of the lens holder.

18. The vehicular camera of claim 14, wherein the lens holder comprises a cylindrical receiving portion for at least partially receiving the lens accommodating portion of the lens barrel therein, and wherein the cylindrical receiving portion comprises the metal portion and the plastic portion.

19. The vehicular camera of claim 18, wherein the plastic portion comprises an annular element established at an outer end of the metal portion of the cylindrical receiving portion.

20. The vehicular camera of claim 18, wherein a ratio of a length of the plastic portion to the metal portion is selected to optimize a thermal focus shift of the vehicular camera.

21. The vehicular camera of claim 14, wherein the plastic portion of the lens holder is adhesively attached at an outboard side of the lens barrel flange that faces away from the PCB.

22. The vehicular camera of claim 14, wherein the plastic portion of the lens holder is adhesively attached at an inboard side of the lens barrel flange that faces toward the PCB.

23. A vehicular camera for a vision system of a vehicle, the vehicular camera configured to be disposed at a vehicle, the vehicular camera comprising:

a camera housing comprising a wall having an inner surface at an inner side of the wall and an outer surface at an outer side of the wall;

a printed circuit board (PCB) having an imager disposed thereat;

a lens barrel accommodating a lens, the lens barrel comprising a first end and a second end, the lens barrel comprising a lens accommodating portion and a lens barrel flange that circumscribes the lens accommodating portion;

wherein the lens barrel flange is adhesively attached at a first attachment surface of the camera housing via adhesive;

wherein the PCB is adhesively attached at a second attachment surface of the camera housing via adhesive;

wherein the first attachment surface of the camera housing and the second attachment surface of the camera housing are at a common side of the wall of the camera housing;

wherein one of the first and second attachment surfaces circumscribes the other of the first and second attachment surfaces, and wherein the one of the first and second attachment surfaces comprises an annular surface at an end of a cylindrical protrusion that protrudes from the common side of the wall of the camera housing; and wherein, with the lens barrel flange adhesively attached at the first attachment surface of the camera housing, and with the PCB adhesively attached at the second attachment surface of the camera housing, the imager is spaced from the lens barrel and the imager is optically aligned with the lens supported at the lens barrel.

24. The vehicular camera of claim 23, wherein the common side of the wall of the camera housing comprises the inner side of the wall of the camera housing, and wherein the wall of the camera housing comprises a lens barrel aperture, and wherein the first end of the lens barrel protrudes through the lens barrel aperture through the wall of the camera housing so as to be protrude beyond the outer surface at the outer side of the wall of the camera housing, and wherein the second attachment surface of the camera housing comprises the annular surface at an inner end of the cylindrical protrusion, and wherein the first attachment surface of the camera housing comprises a portion of the inner surface at the inner side of the wall of the camera housing that is radially inboard from the cylindrical protrusion.

25. The vehicular camera of claim 23, wherein the common side of the wall of the camera housing comprises the outer side of the wall of the camera housing, and wherein the first attachment surface of the camera housing comprises the annular surface at an outer end of the cylindrical protrusion, and wherein the second attachment surface of the camera housing comprises a portion of the outer surface at the outer side of the wall of the camera housing that is radially inward from the cylindrical protrusion.

26. The vehicular camera of claim 23, wherein the adhesive coupling the lens barrel flange to the first attachment surface of the camera housing comprises the same type of adhesive as the adhesive coupling the PCB to the second attachment surface of the camera housing.

* * * * *